United States Patent
J et al.

(10) Patent No.: US 9,742,414 B2
(45) Date of Patent: Aug. 22, 2017

(54) REDUCING ERRORS DUE TO NON-LINEARITIES CAUSED BY A PHASE FREQUENCY DETECTOR OF A PHASE LOCKED LOOP

(71) Applicant: Aura Semiconductor Pvt. Ltd, Bangalore (IN)

(72) Inventors: Raja Prabhu J, Bangalore (IN); Augusto Marques, Bangalore (IN); Srinath Sridharan, Banglaore (IN); Ankit Seedher, Bangalore (IN); Sriharsha Vasadi, Bangalore (IN)

(73) Assignee: AURA SEMICONDUCTOR PVT. LTD, Bangalore (IN)

( * ) Notice: Subject to any disclaimer, the term of this patent is extended or adjusted under 35 U.S.C. 154(b) by 0 days.

(21) Appl. No.: 14/968,930

(22) Filed: Dec. 15, 2015

(65) Prior Publication Data

US 2016/0329902 A1 Nov. 10, 2016

(30) Foreign Application Priority Data

May 5, 2015 (IN) .......................... 2279/CHE/2015

(51) Int. Cl.
| | |
|---|---|
| *H03L 7/06* | (2006.01) |
| *H03L 7/089* | (2006.01) |
| *H03L 7/08* | (2006.01) |
| *G01R 25/00* | (2006.01) |
| *H03L 7/197* | (2006.01) |

(52) U.S. Cl.
CPC .......... *H03L 7/0891* (2013.01); *G01R 25/005* (2013.01); *H03L 7/0805* (2013.01); *H03L 7/1976* (2013.01)

(58) Field of Classification Search
CPC ............................ H03L 7/0891; H03L 7/0805
USPC ..... 327/2, 3, 5, 7, 8, 12, 147–150, 156–159, 327/39, 40, 43, 47, 49; 331/185, 186; 375/371–376; 323/282
See application file for complete search history.

(56) References Cited

U.S. PATENT DOCUMENTS

| | | |
|---|---|---|
| 7,171,183 B2 | 1/2007 | Chien |
| 8,531,217 B2 | 9/2013 | Cloutier et al. |
| 8,704,567 B2 | 4/2014 | Ainspan et al. |
| 2008/0111646 A1 | 5/2008 | Nair |

(Continued)

OTHER PUBLICATIONS

Dennis Fischette, First Time, Every Time—Practical Tips for Phase—Locked Loop Design, http://www.ewh.ieee.org/r6/scv/ssc/June07.pdf, 2009, pp. 1-64.

(Continued)

*Primary Examiner* — Thomas Skibinski
(74) *Attorney, Agent, or Firm* — IPHorizons PLLC; Narendra Reddy Thappeta

(57) ABSTRACT

A phase frequency detector (PFD) includes a first circuit portion and a second circuit portion. The first circuit portion receives a reference signal and activates a first error signal if the phase of the reference frequency leads the phase of a feedback signal. The second circuit portion receives the reference and activates a second error signal if the phase of the reference frequency lags the phase of the feedback signal. The first circuit portion is powered by a first power supply, and the second circuit portion is powered by a second power supply. A PLL implemented using the PFD generates a frequency output with minimized jitter.

20 Claims, 8 Drawing Sheets

(56) References Cited

U.S. PATENT DOCUMENTS

| | | | |
|---|---|---|---|
| 2008/0136472 A1* | 6/2008 | Shor | H03F 3/345 327/156 |
| 2010/0330941 A1* | 12/2010 | Trikha | H04H 40/45 455/180.1 |
| 2011/0215848 A1* | 9/2011 | Koroglu | H03L 7/06 327/157 |

OTHER PUBLICATIONS

NAND Gates MoHAT Project, https://courseware.ee.calpoly.edu/~dbraun/courses/ee307/F04/_ttat/ee307/01_12_ttat_, downloaded circa Apr. 14, 2015, pp. 1-3.

WIT Press, http://www.witpress.com/, downloaded circa Apr. 8, 2015, pp. 1-2.

Advances in Electrical and Electronics Engineering ebook, https://books.google.co.in/books?id=1XULBAAAQBAJ&pg=PA280&lpg=PA280&dq=symmetric+nand+gate+reset+path+PFD&source=bl&ots=cs6GhngT7y&sig=dKgi9Q7sO-EaFiQVDarOKIYToY4&,hl=en&sa=X&ved=0ahUKEwjlievpm-_JAhUUV44KHbjTDj0Q6AEIHTAA#v=onepage&q=symmetric%20nand%20gate%20reset%20path%20PFD&f=false, downloaded circa Apr. 8, 2015, pp. 1-6.

George Von Büren, Christian Kromer, Silvan Wehrli, Alex Huber, Thomas Morf and Heinz Jäckel, Differential Phase Frequency Detector with Zero Systematic Timing Misalignment, http://www.fhnw.ch/technik/ime/publikationen/2009/differential-phase-frequency-detector-with-zero-systematic-timing-misalignment, pp. 1-4.

Adrian Maxim, Design Challenges in Multi-GHz PLL Frequency Synthesizers, http://www.cerc.utexas.edu/msrf-seminar/y2005/tk050503_slides_maxim.pdf, pp. 1-101.

Woogeun Rhee, Ni Xu, Bo Zhou and Zhihua Wang, Fractional-N Frequency Synthesis: Overview and Practical Aspects with FIR-Embedded Design, http://www.jsts.org/html/journal/journal_files/2013/04/year2013volume13_02_10.pdf, Apr. 2013, pp. 1-14.

Curtis Barrett Fractiona/Integer-N PLL Basics http:/www.ti.com/lit/an/swra029/swra029.pdf Texas Instruments, Aug. 1999, pp. 1-55.

Sam Palermo, Special Topics in High-Speed Links Circuits and SystemsSpring 2010, http://www.ece.tamu.edu/~spalermo/ecen689/lecture27_ee689_pll_circuits.pdf, Texas A&M University, pp. 1-39.

Kevin Jia-Nong Wang, Spur Reduction Techniques for Fractional-N PLLs, http://petrified.ucsd.edu/~ispg-adm/pubs/KWangDissertation.pdf, University of California, Copyright 2010, pp. 1-97.

Analog Devices, 8 GHz 16-Bit Fractional-N PLL, http://www.analog.com/media/en/technical-documentation/data-sheets/hmc701.pdf, Hittite Microwave Corporation, pp. 1-42.

Sohail Imran Saeed, Investigation of Mechanisms for Spur Generation in Fractional-N Frequency Synthesizers, http://liu.diva-portal.org/smash/get/diva2:548943/FULLTEXT01.pdf, Jul. 3, 2012, pp. 1-73.

Thomas A. D. Riley, Norman M. Filiol, Qinghong Du and Juha Kostamovaara, Techniques for In-Band Phase Noise Reduction in Synthesizers, http://www.doe.carleton.ca/~nmf/casii_2003.pdf, IEEE Transactions on Circuits and Systems, vol. 50, No. 11, Nov. 2003, pp. 1-10.

Han-Il Lee, Tae-Won Ahn, Duck-Young Jung and Byeong-Ha Park, Scheme for No Dead Zone, Fast PFD Design, http://www.kps.or.kr/jkps/downloadPdf.asp?articleuid=%7B8BA84DA5-3B43-40F8-9B9B-0142A7CC755E%7D, RFIC Development, Semiconductor System LSI Business, Mar. 27, 2002, pp. 1-3.

Tzung-Je Lee and Chua-Chin Wang, A Phase-Locked Loop with 30% Jitter Reduction Using Separate Regulators, http://www.hindawi.com/journals/vlsi/2008/512946/, downloaded circa Apr. 8, 2015, pp. 1-6.

\* cited by examiner

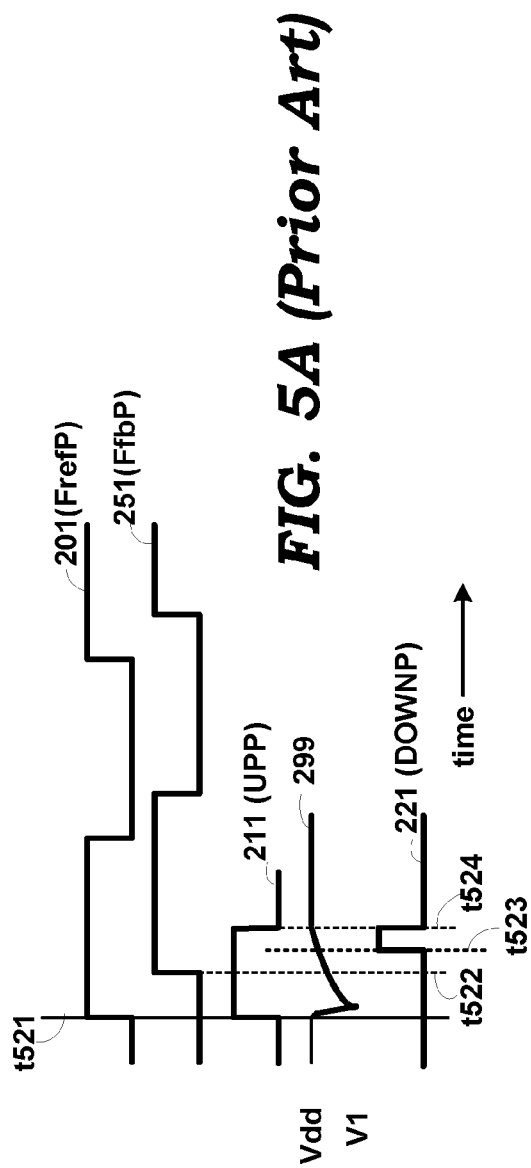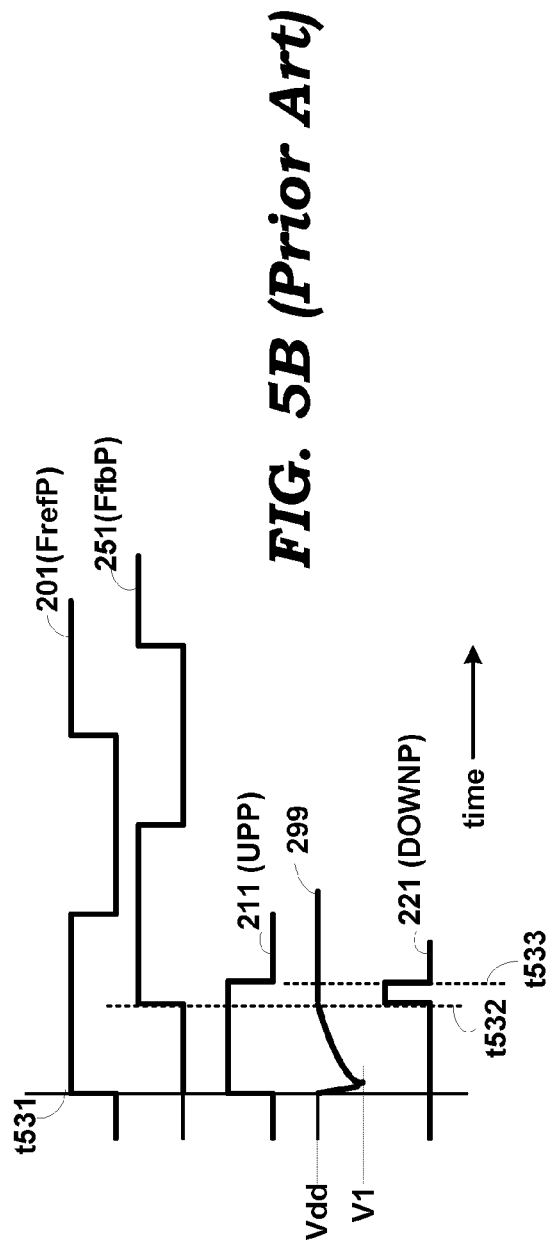

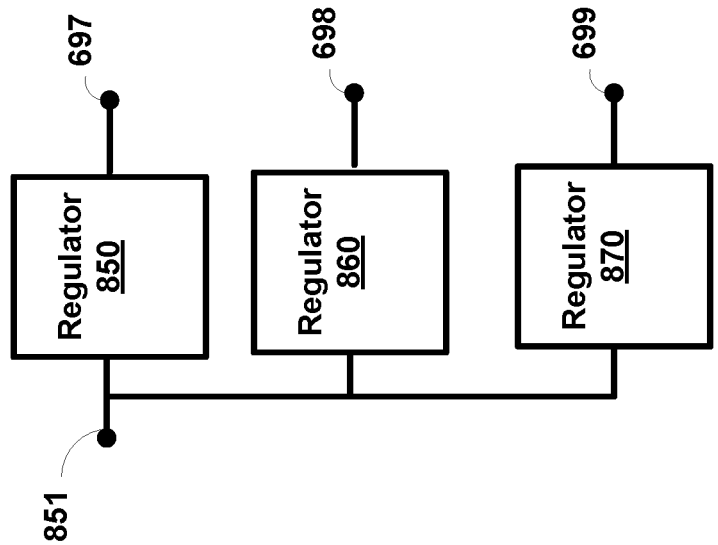
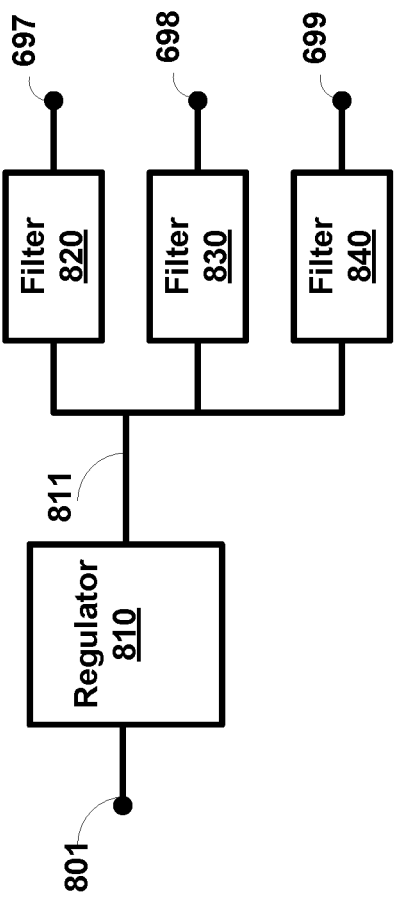
FIG. 8B
FIG. 8A

REDUCING ERRORS DUE TO NON-LINEARITIES CAUSED BY A PHASE FREQUENCY DETECTOR OF A PHASE LOCKED LOOP

PRIORITY CLAIM

The instant patent application claims priority from co-pending India provisional patent application entitled, "OPERATING AT ORIGIN WITHOUT SUFFERING DELTA SIGMA NOISE FOLD OVER", Application Number: 2279/CHE/2015, Filed: 5 May 2015, naming as inventors Prabhu et al, and is incorporated it its entirety herewith, to the extent not inconsistent with the disclosure of the instant application.

BACKGROUND

Technical Field

Embodiments of the present disclosure relate generally to Phase Locked Loops (PLL), and more specifically to reducing errors due to non-linearities caused by a phase frequency detector of a phase locked loop.

Related Art

Phase locked loops (PLL) are often used to synthesize signals (such as clocks) with a desired frequency. Typically, a PLL contains a phase frequency detector (PFD), a loop filter, a voltage controlled oscillator (VCO) and a divider. The PFD compares a reference signal (reference frequency) at a fixed frequency with a feedback signal (which is a frequency-divided output obtained by frequency-dividing the VCO output in the divider), and generates/activates error signals indicative of a phase difference between the reference signal and the output signal of the VCO. The error signals are filtered by the loop filter, and the output of the loop filter is used to adjust the phase/frequency of the VCO output such that the frequency of the VCO output equals a desired multiple of the frequency of the reference signal.

According to one approach, the PFD provides two error signals as outputs once in every period of the reference signal, with a first error signal being activated if the phase of the reference frequency leads the phase of the feedback signal, and a second error signal being activated if the phase of the reference frequency lags the phase of the feedback signal. The two error signals are used for phase-frequency adjustment of the VCO output as noted above.

The transfer function of a PFD refers to the relationship between the output of the PFD with respect to the input. In general, it is desirable that the transfer function be linear. Non-linearities in the transfer function of a PFD refer to effects due to the implementation and/or operation of the PFD which cause a deviation from a straight line in the transfer characteristics of the PFD. One or more of such non-linear effects may potentially result in errors in the output signal of the PLL, such as for example, increased/additional phase-noise (also termed jitter) in the output signal.

Embodiments of the present disclosure are directed to reducing errors due to non-linearities caused by a PFD of a PLL.

BRIEF DESCRIPTION OF THE VIEWS OF DRAWINGS

Example embodiments of the present disclosure will be described with reference to the accompanying drawings briefly described below.

FIGS. 5A and 5B are example timing diagrams used to illustrate non-ideal behavior of a prior phase frequency detector.

FIG. 8A is a block diagram illustrating the manner in which power supplies for components of phase frequency detector are generated in an embodiment of the present disclosure.

FIG. 8B is a block diagram illustrating the manner in which power supplies for components of phase frequency detector are generated in an alternative embodiment of the present disclosure.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A phase frequency detector (PFD) includes a first circuit portion and a second circuit portion. The first circuit portion receives a reference signal and activates a first error signal if the phase of the reference frequency leads the phase of a feedback signal. The second circuit portion receives the reference and activates a second error signal if the phase of the reference frequency lags the phase of the feedback signal. The first circuit portion is powered by a first power supply, and the second circuit portion is powered by a second power supply. A PLL implemented using the PFD generates a frequency output with minimized jitter.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Phase Locked Loop

Figure 1:
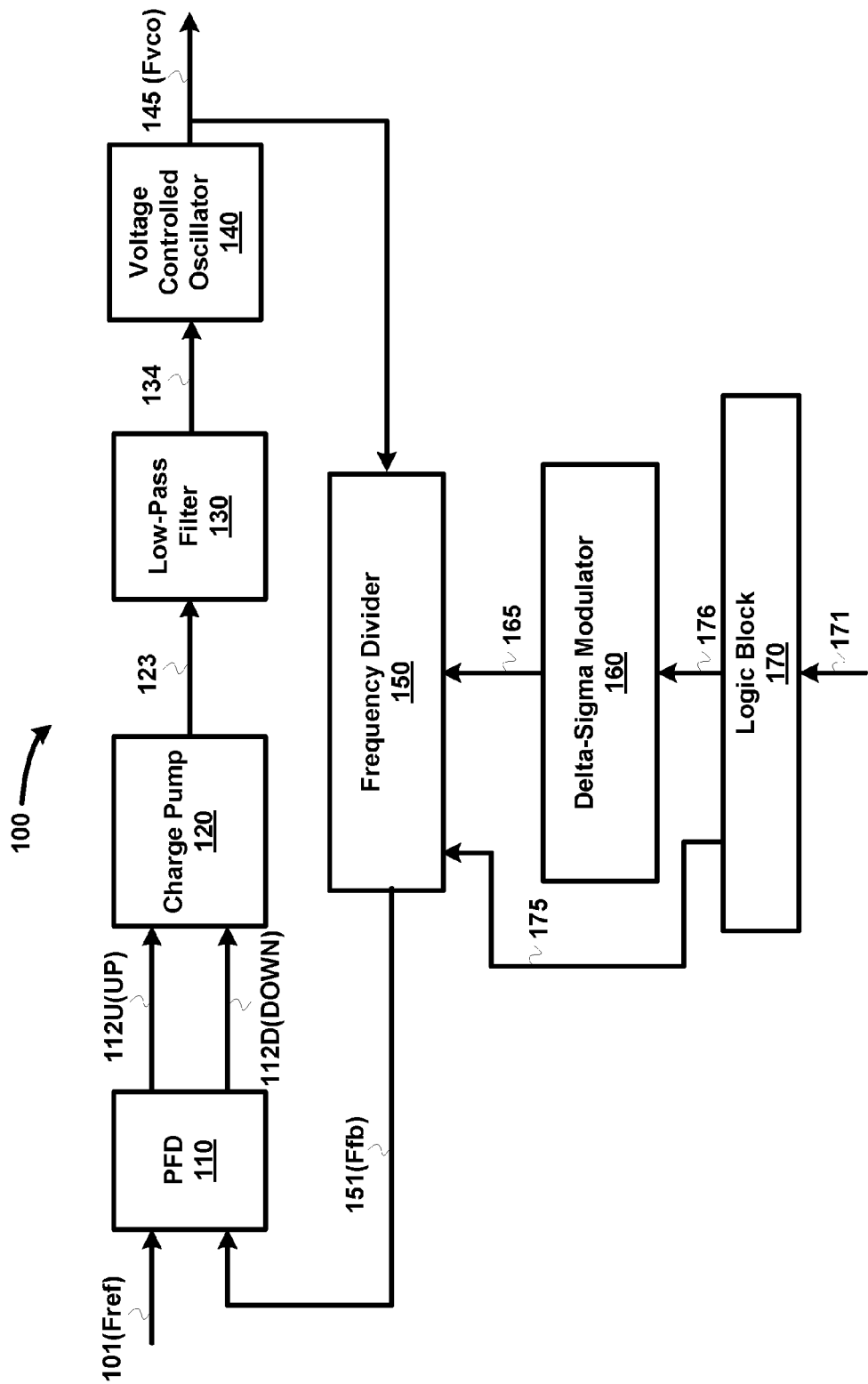
FIG. 1 is a block diagram of an example device in which several aspects of the present disclosure can be implemented.

FIG. 1 is a block diagram of an example device in which several aspects of the present disclosure can be implemented. Phase locked loop (PLL, also termed a frequency synthesizer) 100 of FIG. 1 is shown containing phase frequency detector (PFD) 110, charge pump 120, low-pass filter (LPF) 130, voltage controlled oscillator (VCO) 140, frequency divider 150, delta-sigma modulator (DSM) 160 and logic block 170. PLL 100 may be implemented as an integer-only PLL or a fractional PLL (as noted below), and may be implemented in integrated circuit (IC) form.

VCO 140 generates an output signal Fvco on path 145, with the frequency of Fvco being determined by the (instantaneous) magnitude of voltage received on path 134. Fvco is typically a square wave or sinusoidal wave, and may be used by other systems (not shown) as a clock signal (after appropriate processing or conditioning, if so desired).

Frequency divider 150 receives Fvco as an input, divides the frequency of Fvco by a desired divide ratio, and provides the frequency-divided signal as a feedback signal Ffb on path 151. The divide ratio is an integer (N) if PLL 100 is implemented as an integer-only PLL/frequency synthesizer, and a fractional number (N.f), if PLL 100 is implemented as a fractional PLL/frequency synthesizer. In the fractional number N.f, N represents the integer portion, f represents the fractional portion, and '.' represents the decimal point.

Logic block 170 receives a divide ratio (e.g., from a user) on path 171. When PLL 100 is implemented as a fractional PLL, logic block 170 forwards the fractional portion 'f' of the divide ratio to DSM 160 on path 176. DSM 160 generates (in one of several known ways) a sequence of divide values corresponding to the fractional part, and provides the sequence to frequency divider 150 on path 165. Logic block forwards the integer portion of the divide ratio to frequency divider 150 on path 175. Frequency divider 150 determines the divide ratio per cycle of reference frequency 101 by adding the inputs received on paths 175 and 165. Alternatively, such addition may be performed in a separate block, not shown, which would then provide the sum to frequency divider 150. When PLL 100 is implemented as an integer-only PLL, DSM 160 is not implemented, and logic block 170 forwards the divide ratio received on path 171 to frequency divider 150 on path 175. In an alternative embodiment, the input provided on path 171 represents a desired output frequency (for Fvco), and logic block 170 computes the corresponding divide ratio based on input 171. In yet other embodiments, other well-know techniques such as fractional dividers may be employed instead of using DSM 160.

PFD 110 receives as inputs, a reference frequency Fref on path 101 and feedback signal Ffb on path 151, and operates to generate error signals UP and DOWN on respective paths 112U and 112D. The ON (active) durations (illustrated in greater detail below with respect to FIG. 2) of error signals UP and DOWN are proportional to the amount of phase by which Fref leads or lags Ffb respectively. Reference frequency Fref may be generated by an oscillator (not shown) contained within PLL 100.

Charge pump 120 converts the UP and DOWN outputs of PFD 110 to charge (provided on path 123). Charge pump 120 may employ a current source and current sink, which respectively output into node 123, positive and negative current pulses proportional to the widths (active durations) of signals UP and DOWN. LPF 130 is a low-pass filter, and converts the charge received on path 123 to a voltage 134. VCO 140 generates Fvco with a frequency that is dependent on the magnitude of voltage 134.

The components/blocks of FIG. 1 may be designed to enable generation of Fvco with frequencies in a desired range.

As noted above, non-linearities in the transfer function of PFD 110 may result in increased/additional phase noise/jitter in Fvco. A PFD implemented according to the present disclosure enables reduction of such errors, as described in detail below. Several aspects of the present disclosure will be clearer in comparison with a prior implementation of a PFD. Accordingly, the prior implementation and its operation are briefly described next with respect to FIGS. 2, 3 and 4.

3. Prior PFD

Figure 2:
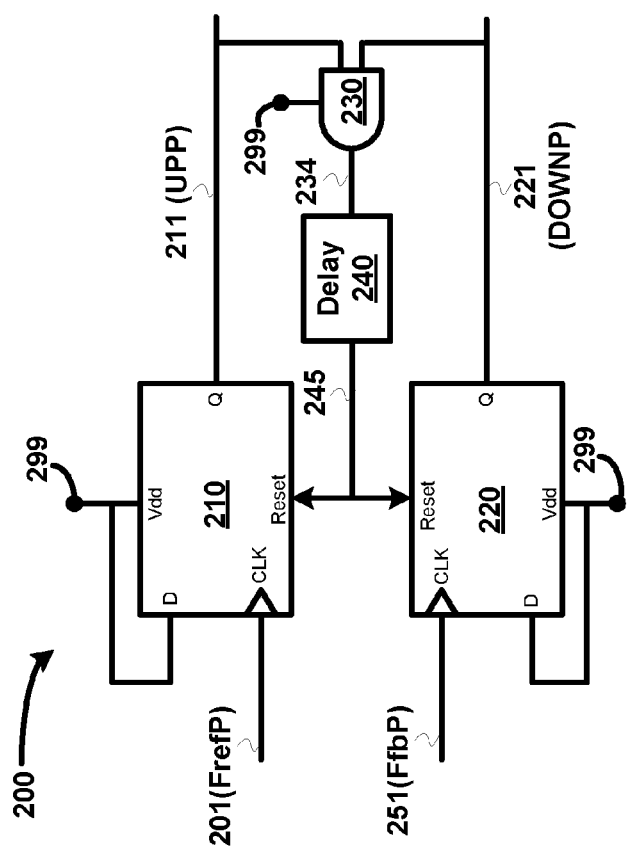
FIG. 2 is a block diagram illustrating the implementation details of a prior phase frequency detector.

FIG. 2 is a diagram illustrating the implementation details of a prior PFD. Prior PFD 200 is shown in FIG. 2 as containing D-type flip-flops 210 and 220, AND gate 230 and delay element 240. Each of components 210, 220, and 230 receives power supply for operation from a same power supply node 299. Power supply 299 may be generated by a (same) voltage regulator (not shown). Delay element 240 may be implemented as a digital delay element or a passive or active analog delay element. When implemented as a digital delay element or an active analog delay element, delay element 240 may be powered by power supply 299.

The data (D) inputs of each of flip-flops 210 and 220 is connected to power supply node 299, and is thus at logic high. The clock (CLK) inputs of flip-flops 210 and 220 are respectively connected to reference frequency FrefP (201) and a feedback signal FfbP (251). Signals 201 and 251 correspond respectively to signals 101 and 151 of FIG. 1. The Q output of flip-flop 210 provides UPP 211, and the Q output of flip-flop 220 provides DOWNP 211. Signals UPP 211 and DOWNP 221 correspond respectively to signals UP (112U) and DOWN (112D) of FIG. 1. AND gate 230 provides the result of a logical AND operation on signals UPP and DOWNP on path 231. Delay element 240 delays the signal on path 231, and provides a delayed signal on path 245, which is connected to the RESET inputs of each of flip-flops 210 and 220.

Figure 3:
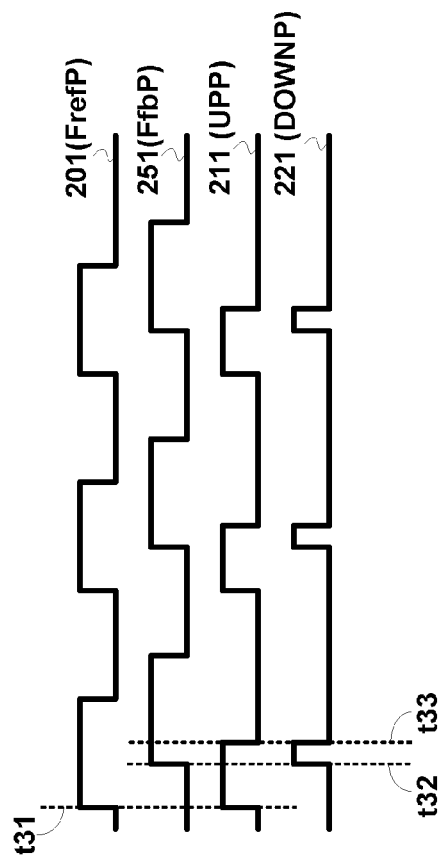
FIG. 3 is an example timing diagram illustrating the operation of a phase frequency detector in an ideal scenario.

The example timing diagram of FIG. 3 illustrates the operation of prior PFD 200 in an ideal scenario. In FIG. 3, the phase of FrefP is shown as leading the phase of FfbP by an angle that corresponds to interval t31-t32. At time t31, FrfeP transitions to logic high. Consequently, UPP transitions to logic high also at t31. At time t32, FfbP transitions to logic high. Consequently, DOWNP transitions to logic high also at t32. Time intervals t32-t33 represents the delay provided by delay element 240. The logic high output of AND gate 230 resets each of flip-flops 210 and 220 at t33. Consequently, UPP and DOWNP transition to logic low at t33. Thus, signal UPP is asserted (activated) for a duration which is the sum of the durations for which FrefP leads FfbP and a constant delay (termed reset delay) equal to t32-t33 provided by delay element 240. Signal DOWNP on the other hand is not asserted for the duration t31-t32, but only for the length of the reset delay. The reset delay is introduced to prevent a dead-zone in the response of PFD 200, as is well known in the relevant arts.

When, the phase of FrefP lags that of FfbP (not shown in the Figures), DOWNP is asserted (activated) for a duration which is the sum of the durations for which FrefP lags FfbP and the reset delay. UPP on the other hand is asserted only for the duration of the reset delay. For other values of phase lead of FrefP with respect to FfbP, the width of UPP will be correspondingly different. Similarly, for other values of phase lag of FrefP with respect to FfbP, the width of DOWNP will be correspondingly different. Reset delays are always added to UPP and DOWNP irrespective of the specific phase lead or phase lag between FrefP and FfbP.

In the ideal scenario, the transfer characteristics of PH) 200 is a straight line, i.e., the difference between the ON durations of UPP and DOWNP (i.e., UPP-DOWNP) must increase linearly for increasing phase lead of FrefP with respect to Ffb, and the difference between the ON durations of DOWNP and UPP (i.e., DOWNP-UPP) must increase linearly for increasing phase lag of FrefP with respect to Ffb. Thus, the ideal linear transfer characteristics of PH) 200 would be as represented by dotted straight line 420 of FIG. 4.

Figure 4:
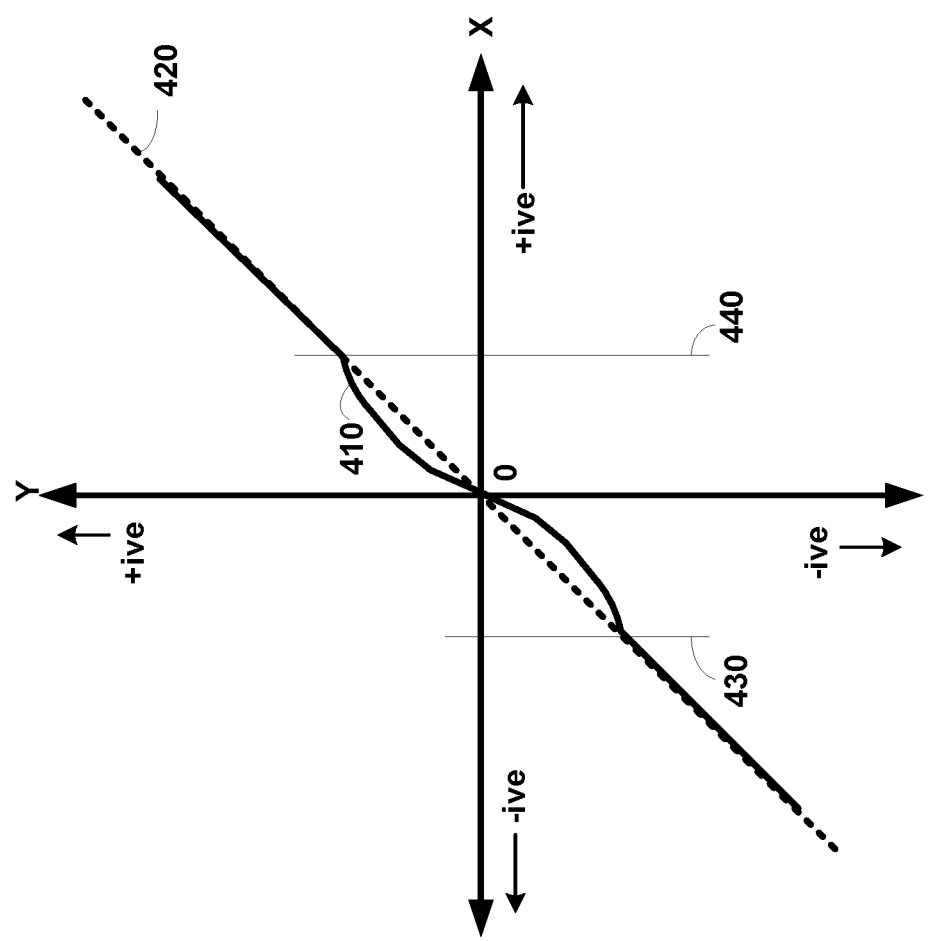
FIG. 4 is a diagram illustrating ideal and non-ideal transfer characteristics of a phase frequency detector.

In FIG. 4, phase difference between FrefP and FfbP is indicated along the X-direction, and difference between the active (ON) durations of the UPP and DOWNP signals is indicated along the Y-direction. Increasing phase leads (starting from zero) of FrefP with respect to FfbP are along the positive (+ive) X-direction, increasing phase lags (starting from zero) of FrefP with respect to FfbP are along the negative (−ive) X-direction. Increasing values of (UPP-DOWNP) durations are along the positive (+ive) Y-direction, and increasing values of (DOWNP-UPP) are along the negative (−ive) Y-direction. In an alternative embodiment of PFD 200, the transfer function could have a negative slope, wherein increasing phase leads correspond to decreasing values of (UPP-DOWNP), and vice-versa.

Due to non-linearity in the design/operation of PFD 200, the transfer characteristics of PH) 200 may deviate from the ideal straight line response 420 (shown as a dotted line in FIG. 4). An example non-linear (non-ideal) response of PFD 200 is represented by response 410 (indicated in bold). It may be observed that response 410 is not linear, at least for phase differences in the region between markers 430 and 440. Although not shown herein, several other specific manner/shape of deviations (i.e., non-linearity) from the straight line linear characteristic 420 are possible.

One cause for the non-linearity represented by response 410 (as well as other manner/shapes of deviations, as noted above) is power supply modulation due to switching of digital signals (e.g., UPP and DOWN) within PFD 200, as illustrated briefly with respect to FIGS. 5A and 5B. FIG. 5A shows the response of PFD 200 when the phase of FrefP leads that of FfbP by an angle corresponding to duration t521-t522. UPP transitions to logic high at t521 in response to FrefP transitioning to logic high and FfbP being at logic low. The transition of UPP from logic low to logic high causes power supply voltage 299 (normal voltage Vdd) to fall to a lower voltage V1. Supply 299 is shown as recovering to its normal value Vdd only by time instant t524. The temporary dip in supply 299 causes delay in generation of digital signals in PH) 200 in the interval for which supply 299 is less than Vdd. Thus, for example, DOWNP (generated by flip-flop 220), which should have transitioned to logic high at t522 transitions to logic high only at t523, thereby resulting in the active duration of UPP being extended (UPP transitioning to logic low only at t524, although such transition should have occurred earlier).

FIG. 5B shows the response of PFD 200 when the phase of FrefP leads that of FfbP by an angle corresponding to duration t531-t532 (which assumed to be longer than interval t521-t522 of FIG. 5A). UPP transitions to logic high at t531 in response to FrefP transitioning to logic high and FfbP being at logic low. The transition of UPP from logic low to logic high causes power supply voltage 299 (normal voltage Vdd) to fall to a lower voltage V1. Supply 299 is shown as recovering to its normal value Vdd only by time instant t532. Time interval t531-t532 is assumed to be equal to time interval t521-t524 of FIG. 5A. Since supply 299 has already recovered by t532 (the time at which DOWNP should transition to logic high), the transition of DOWNP is not delayed. As a result, the ON duration of UPP is not 'extended' as in the case of FIG. 5A.

In general, delay in activation of the DOWNP signal, and therefore 'lengthening' of the UPP active duration may occur only for small phase leads of FrefP with respect to FfbP, with the specific degree of lengthening being possibly different for different phase lead values. For phase lead values to the right of marker 440, no lengthening may occur at all.

Similarly, lengthening of the DOWNP signal may occur only for small phase lags of FrefP with respect to FfbP (phase lags from 0 to marker 430). Again, the specific degree of lengthening may possibly be different for different phase lead values. For phase lead values to the left of marker 430, no lengthening may occur at all.

Further, although not indicated in FIG. 4, the portion of response 410 for positive values of phase lead of FrefP with respect to FfbP may not be identical with the portion for negative value of phase lead of FrefP with respect to FfbP. For example, power supply noise (dip in supply voltage 299 due to switching of digital signals in flip-flops 210 and 220) may affect UPP and DOWNP signals differently. As a result, there may be further non-linearity due to asymmetry in response 410 for equal but opposite phase differences. Further, the supply modulation due to switching of one or more digital signals in flip-flops 210 and 220 may also affect the delays in delay element 240 and in AND gate 230.

It is to be noted that one or more of the errors/non-linear effects noted above will be present for cases where a (single) practical voltage supply (which will have some output impedance) such as a regulator is used for powering the PFD.

The non-linear effects noted above may be especially problematic in PLLs that achieve fractional-N synthesis. For such PLLs, the fraction is realized by operating feedback divider of the PLL with a delta sigma modulator, as noted above with respect to FIG. 1. Noise of the delta sigma modulator rises with frequency and the non-linear PFD characteristic can cause the noise to fold over in-band. This folded noise in-band cannot be filtered by the forward path low-pass filter in the PLL. It may therefore be important to have linear PFD transfer characteristics.

A PFD implemented according to aspects of the present disclosure enables reduction of errors (e.g., jitter) in the output of a PLL, as described next.

4. Phase Frequency Detector

Figure 6:
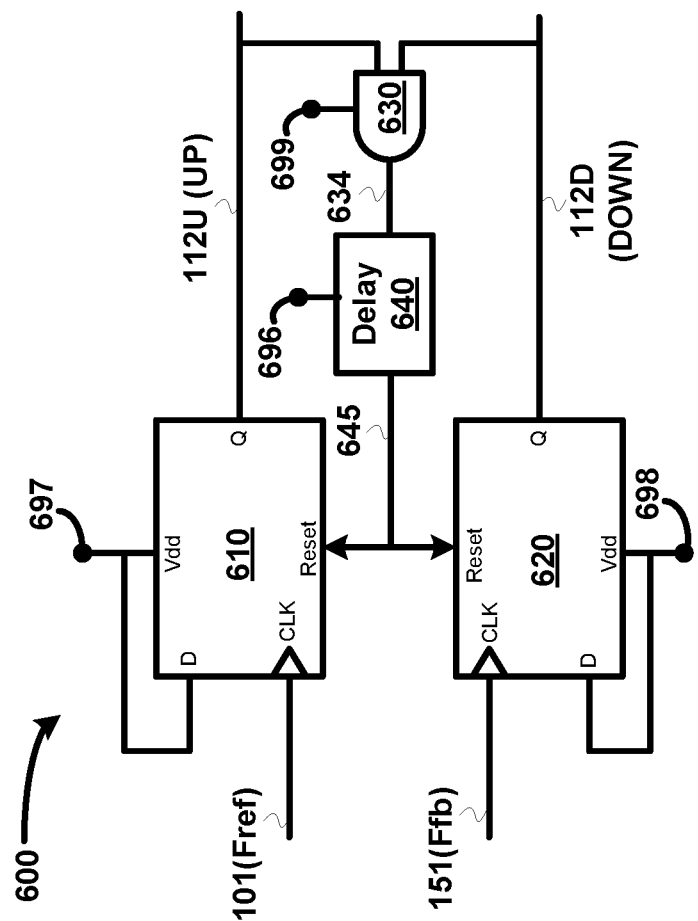
FIG. 6 is a block diagram illustrating the implementation details of a phase frequency detector in an embodiment of the present disclosure.

FIG. 6 is a block diagram of a PFD in an embodiment of the present disclosure. PFD 600, which can be implemented in place of PFD 110 of FIG. 1, is shown containing D-type flip-flops 610 and 620, AND gate 630 and delay element 640.

The data (D) inputs of each of flip-flops 610 and 620 is connected to respective power supply nodes 697 and 698, and is thus at logic high. The clock (CLK) inputs of flip-flops 610 and 620 are respectively connected to receive reference frequency Fref (101) and feedback signal Ffb (151). The Q output of flip-flop 610 provides UP 112U, and the Q output of flip-flop 620 provides DOWN 112D. AND gate 230 provides the result of a logical AND operation on signals UP and DOWN on path 634. Delay element 640 delays the signal on path 634, and provides a delayed signal on path 645, which is connected to the RESET inputs of each of flip-flops 610 and 620.

Power for operation of each of flip-flops 610 and 620 and AND gate 630 are provided by separate power supplies at respective power supply nodes 697, 698 and 699. Thus, flip-flop 610 is powered by power supply 697, flip-flop 620 is powered by power supply 698 and AND gate 630 is powered by power supply 699. When delay element 640 is implemented as a digital block or as an active analog block, delay element 640 receives power for operation from a power supply 696. When implemented as a passive analog block (e.g., RC (resistor-capacitor) network, cascaded stages of inductors and capacitors, etc.), a power supply may not be required for operation of delay element 640.

In an embodiment, each of power supplies 697, 698 and 699 is a separate power (voltage) source, such as a battery. In another embodiment illustrated with respect to FIG. 8A, each of power supplies 697, 698 and 699 is derived from a same source 801 (e.g., battery), but has separate filters and/or reservoir capacitors. Power supply regulator 810 generates a regulated power supply on node 811, and may be implemented as a linear or switching regulator. Each of filters 820, 830 and 840 receives the regulated power supply on node 811, and operates to maintain the power supplies at nodes 697, 698 and 699 at a constant desired value, despite load changes/fluctuations. Regulator 810 and filters 820, 830 and 840 may be implemented in a known way. For example, power supply filters may typically be implemented as RC networks on chip or as ferrite beads with capacitors on board, among one of several possible ways of implementation.

In an alternative embodiment of the present disclosure, each of power supplies 697, 698 and 699 is provided by a separate power supply regulator, as illustrated in FIG. 8B. Each of regulators 850, 860 and 870 may be implemented as a linear or switching voltage regulator, and receives power from a power source 851, which may be an unregulated power supply. Each of regulators 850, 860 and 870 provides a regulated power supply (respectively at power supply nodes 697, 698 and 699). Although not shown, reservoir capacitors may be used at each of power supply nodes 697, 698 and 699. Although not shown in the Figures, if delay element 640 requires a power supply for operation, a separate filter (as shown in FIG. 8A) or separate regulator (as shown in FIG. 8B) may be used to power delay element 640 from a separate power supply node. Thus, in the embodiment of FIG. 8B the power supply node at which each of the power supplies is tapped is connected directly (i.e., without any intervening components) to a corresponding (different) voltage regulator. The regulators and filters of FIGS. 8A and 8B may be implemented within a PLL/frequency synthesizer that includes PFD 600.

In yet another embodiment, one regulator may be used to power two components (e.g., delay 640 and AND gate 630, while separate regulators may be used for each of units 610 and 620. Similarly, the output of one filter of the arrangement of FIG. 8A may be used to power delay 640 and AND gate 630 (or some other grouping), while the other regulators may each provide power for unit 610 and 620. Various other combinations are also possible, as would be apparent to one skilled in the relevant arts upon reading the disclosure herein.

It may be appreciated that a power supply is characterized by the corresponding node at which the power is tapped. Before such tap point, any component in the path (e.g., regulator and filter in FIG. 8A, and mere regulators in FIG. 8B) operate only to provide power with a desired characteristic(s) (typically to obtain an ideal fixed voltage), while after the tap point, the power operates to aid processing, generation, etc., of corresponding signals (reference, feedback, etc.).

Figure 7A:
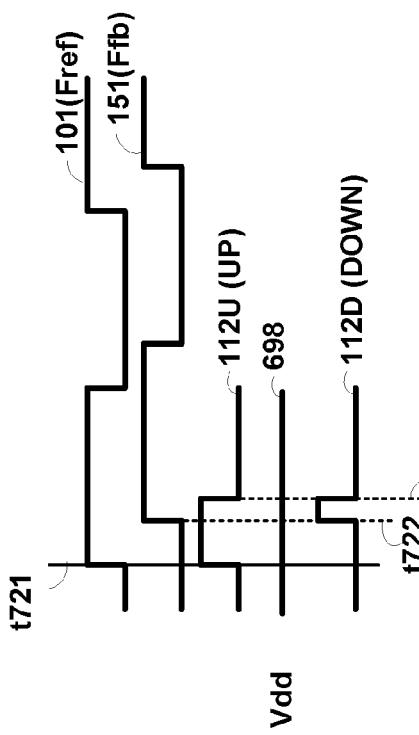
FIGS. 7A and 7B are example timing diagrams used to illustrate the behavior of a phase frequency detector implemented according to aspects of the present disclosure.
Figure 7B:
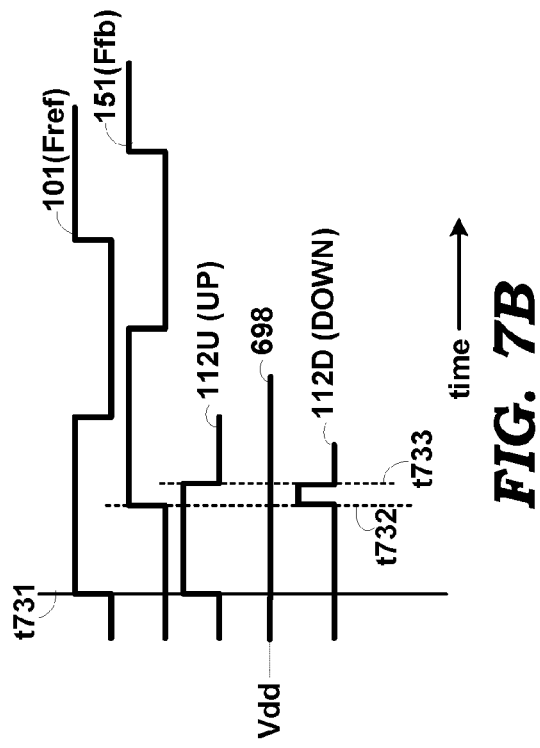

It may be further appreciated that the use of separate power supplies as noted above for powering respective ones of blocks 610, 620, 630 and 640 (where applicable) may substantially reduce or eliminate delays in the digital outputs UP and/or DOWN of PFD 600, and thereby either substantially reduce or eliminate non-linearities (e.g., of the form shown in response 410 of FIG. 4). Consequently, jitter or phase noise in Fvco (145) of PLL 100 when implemented using PFD 600 in place of PFD 110 may be correspondingly reduced or eliminated. FIGS. 7A and 7B show example waveforms illustrating the operation of relevant portions of PH) 600, in which supply modulation effects are assumed to be absent.

FIG. 7A shows the response of PFD 600 when the phase of FrefP leads that of FfbP by an angle corresponding to duration t721-t722. Duration t721-t722 is assumed to equal duration t521-t522 of FIG. 5A. UP transitions to logic high at t721 in response to Fref transitioning to logic high and Ffb being at logic low. Since power supply 698 is separate from power supply 697, the transition of UP from logic low to logic high does not affect power supply 698, which continues to be at voltage Vdd. Hence, generation of DOWN (coincident with transition of Ffb to logic one at t722 is not delayed, and the active duration of UP is not extended as in the prior approach and as illustrated with respect to FIG. 5A. Each of UP and DOWN transitions to logic low after a 'reset delay' duration. It may be observed that the timing of signals in FIG. 7A matches the timing in the ideal scenario illustrated with respect to FIG. 3.

FIG. 7B shows the response of PFD 600 when the phase of FrefP leads that of FfbP by an angle corresponding to duration t731-t732 (which assumed to be equal to interval t531-t532 of FIG. 5B). UP transitions to logic high at t731 in response to Fref transitioning to logic high and Ffb being at logic low. Since power supply 698 is not affected by the transition of UP to logic one, the transition of DOWN to logic one is not delayed. As a result, the ON duration of UP is not 'extended'. Each of UP and DOWN transitions to logic low after a 'reset delay' duration. The active duration of UP is equal to that of UPP shown in FIG. 5B. The reset delay is introduced to prevent a dead-zone in the response of PFD 600, as is well known.

It is noted here that while PFD 600 is shown as using an AND gate (630), other types of logic gates may also be used instead of an AND gate, with corresponding changes that would be apparent to one skilled in the relevant arts. Further, while both flip-flops 610 and 620 are shown as positive-edge-triggered, flip-flops 610 and 620 can be implemented to be negative-edge-triggered, with corresponding changes that would also be apparent to one skilled in the relevant arts. Further, flip flops 610 and/or 620 themselves can be implemented as other possible arrangements of combinational gates (such as AND, NAND, NOR, OR, NOT, XOR gates) that are arranged to implement the sequential operation needed by the PFD.

PLL 100 implemented with PFD 600 in place of PFD 110 can be used as part of a system as described next.

8. System

Figure 9:
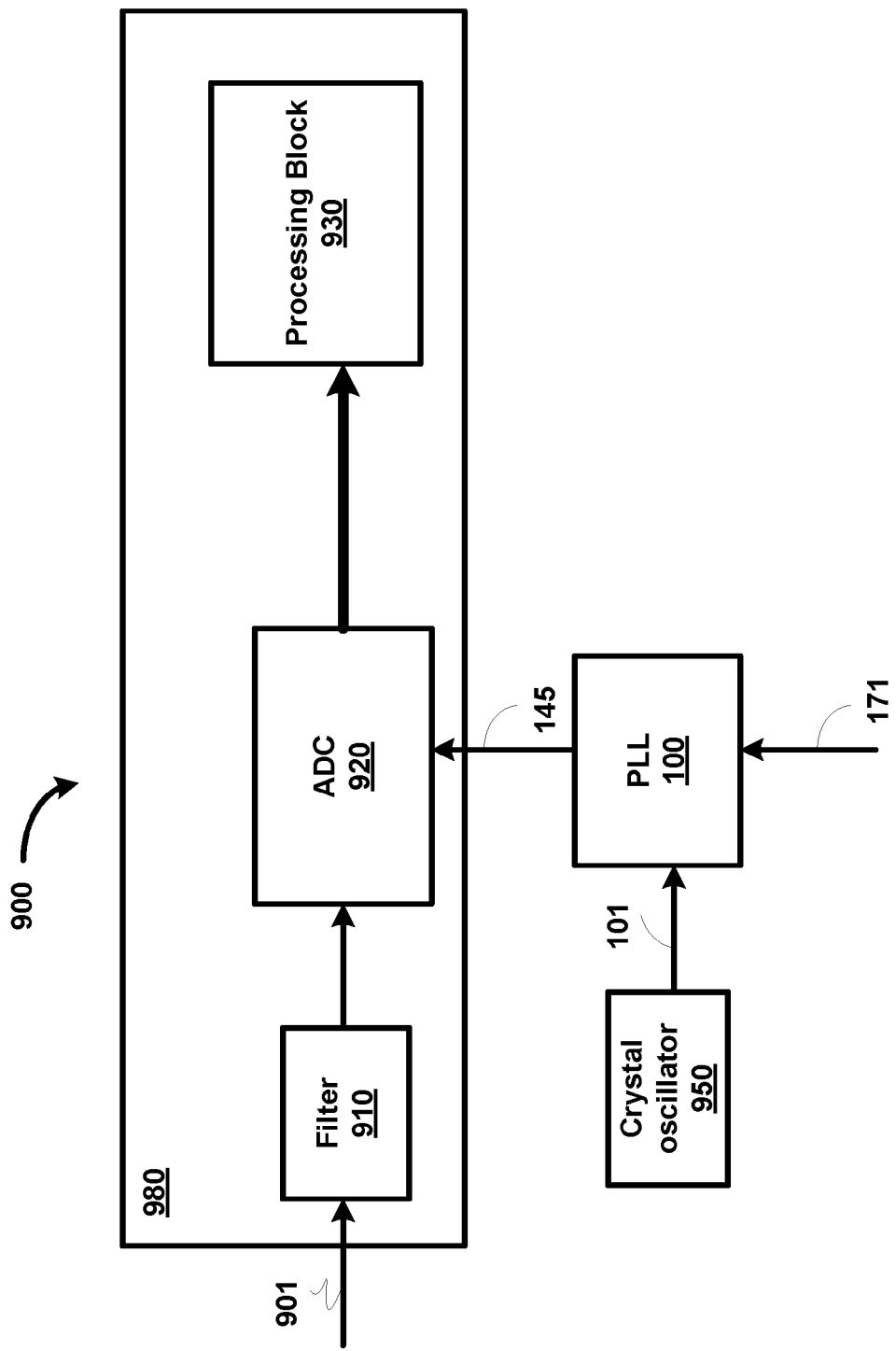
FIG. 9 is a block diagram of a system incorporating a PLL implemented according to several aspects of the present disclosure.

FIG. 9 is a block diagram of a system in which a PLL implemented according to aspects of the present disclosure can be used. System 900 is shown containing signal processing block 980, crystal oscillator 950 and PLL 100. Signal processing block 980 is in turn shown containing filter 910, analog to digital converter (ADC) 920 and processing block 930. PLL 100 is implemented to contain PH) 600 in place of PFD 110. The regulators and filters of FIGS. 8A and 8B are assumed to be contained within PLL 100 implemented to contain PFD 600 in place of PFD 110.

Filter 910, which may be an anti-aliasing filter, of system 100 receives an analog signal on path 901, and provides a filtered signal (low-pass or band-pass filtered) to ADC 920. ADC 920 receives a sampling clock on path 145 from PLL 100, and generates digital codes representing the magnitude of the received filter signal at time instances (e.g., rising edges) specified by sampling clock 145. Processing block 930 receives the digital codes, and processes the digital codes in a desired manner (for example for signal processing applications).

Crystal oscillator 950 generates reference frequency 101 at a fixed (desired) frequency. PLL 100 receives, on path 171, either a divide ratio (integer or fractional) or an input representing the desired output frequency (Fvco), and reference frequency 101, and generates sampling clock 145 at a frequency determined by the divide ratio 152 and the frequency reference frequency 101. Due to the implementation of PLL 100 with PFD 600, and as described in detail above, sampling clock 145 has very low jitter. As a result, system 100 can be implemented as a high-accuracy signal processing system.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 9, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A phase frequency detector (PFD) comprising:
   a first circuit portion to receive a reference signal (Fref) and to activate a first error signal (UP) if the phase of said reference frequency (Fref) leads the phase of a feedback signal (Ffb); and
   a second circuit portion to receive said feedback signal (Ffb) and to activate a second error signal (DOWN) if the phase of said reference frequency (Fref) lags the phase of said feedback signal (Ffb),
   wherein said first circuit portion is powered by a first power supply, and wherein said second circuit portion is powered by a second power supply, wherein said first power supply is different from said second power supply.

2. The PFD of claim 1, wherein said first power supply is received at a first node, said first node being connected directly to a first voltage regulator,
   wherein said second power supply node is received at a second node, said second node being connected directly to a second voltage regulator,
   wherein each of said first voltage regulator and said second voltage regulator receives a same unregulated power supply, said first regulator generating said first power supply at said first node, and said second voltage regulator generating said second power supply at said second node.

3. The PFD of claim 1, wherein said first power supply is received at a first node, wherein said first node is directly connected to an output of a first filter, wherein said first filter is coupled to an output of a voltage regulator,
   wherein said second power supply is received at a second node, wherein said second node is directly connected to an output of a second filter, wherein said second filter is coupled to said output of said voltage regulator.

4. The PFD of claim 1, further comprising a logic gate to receive each of said first error signal and said second error signal, an output of said logic gate to reset the operation of each of said first circuit portion and said second circuit portion,
   wherein said logic gate is powered by a third power supply different from each of said first power supply and said second power supply.

5. The PFD of claim 4, further comprising a delay element, said delay element to delay said output of said logic gate.

6. The PFD of claim 5, wherein said first circuit portion comprises a first D-flip-flop and said second circuit portion comprises a second D-flip-flop,
   wherein a data input of said first D-flip-flop is coupled to receive said first power supply, wherein a clock input of said first D-flip-flop is coupled to receive said reference signal, wherein an output of said first D-flip-flop provides said first error signal,
   wherein a data input of said second D-flip-flop is coupled to receive said second power supply, wherein a clock input of said second D-flip-flop is coupled to receive said feedback signal, wherein an output of said second D-flip-flop provides said second error signal.

7. The PFD of claim 5, wherein said third power supply is also used to power said delay element.

8. A phase locked loop (PLL) comprising:
   a phase frequency detector (PFD) to receive a reference frequency and a feedback frequency, said PFD to generate a first error signal (UP) and a second error signal (DOWN), said first error signal and said error signal being representative of a phase difference between said reference frequency and said feedback frequency;
   a charge pump coupled to receive each of said first error signal and said second error signal, and to generate a corresponding charge;
   a low-pass filter (LPF) coupled to receive said charge, and to convert said charge into a voltage;
   a voltage controlled oscillator (VCO) coupled to receive said voltage, and to generate an output signal; and
   a frequency divider coupled to receive said output signal, and to divide a frequency of said output signal to generate said feedback frequency, wherein said PFD comprises:
a first circuit portion to receive said reference signal (Fref) and to activate said first error signal (UP) if the phase of said reference frequency (Fref) leads the phase of said feedback signal (Ffb); and
a second circuit portion to receive said feedback signal (Ffb) and to activate said second error signal (DOWN) if the phase of said reference frequency (Fref) lags the phase of said feedback signal (Ffb),
wherein said first circuit portion is powered by a first power supply, and wherein said second circuit portion is powered by a second power supply, wherein said first power supply is different from said second power supply.

9. The PLL of claim 8, further comprising a first voltage regulator and a second voltage regulator, wherein said first power supply is received at a first node of said PFD, said first node being connected directly to said first voltage regulator,
wherein said second power supply node is received at a second node of said PFD, said second node being connected directly to said second voltage regulator,
wherein each of said first voltage regulator and said second voltage regulator receives a same unregulated power supply, said first regulator generating said first power supply at said first node, and said second voltage regulator generating said second power supply at said second node.

10. The PLL of claim 8, further comprising a first filter, a second filter, and a voltage regulator, wherein said first power supply is received at a first node of said PFD, wherein said first node is directly connected to an output of said first filter, wherein said first filter is coupled to an output of said voltage regulator,
wherein said second power supply is received at a second node, wherein said second node is directly connected to an output of said second filter, wherein said second filter is coupled to said output of said voltage regulator.

11. The PLL of claim 10, further comprising a third filter and a logic gate, said logic gate coupled to receive each of said first error signal and said second error signal, an output of said logic gate coupled to a reset input of each of said first circuit portion and said second circuit portion,
wherein said logic gate is powered by a third power supply obtained at an output of said third filter, wherein said third filter is coupled to said output of said voltage regulator.

12. The PLL of claim 11, further comprising a delay element, said delay element to delay said output of said logic gate.

13. The PLL of claim 11, wherein said third power supply is also used to power said delay element.

14. The PLL of claim 8, wherein a ratio of the frequency of said output signal to the frequency of said feedback frequency comprises an integer portion and a fractional portion, said PLL further comprising:
a logic block to receive input data specifying each of said integer portion and said fractional portions from a user, said logic block to forward said integer portion directly to said frequency divider; and
a delta sigma modulator (DSM) to receive said fractional portion from said logic block, and to generate a sequence of divide values corresponding to said fractional part, wherein said DSM forwards said sequence to said frequency divider,
wherein said frequency divider adds said integer portion to each of said divide values in said sequence to obtain a corresponding number by which to divide said frequency of said output signal to generate said feedback frequency.

15. A system comprising:
an oscillator to generate a reference frequency;
a phase locked loop (PLL) to generate a sampling clock based on said reference frequency; and
a signal processing block to receive an input signal, and to process said input signal based on time instants specified by said sampling clock,
wherein said PLL comprises:
a phase frequency detector (PFD) to receive said reference frequency and a feedback frequency, said PFD to generate a first error signal (UP) and a second error signal (DOWN), said first error signal and said error signal being representative of a phase difference between said reference frequency and said feedback frequency;
a charge pump coupled to receive each of said first error signal and said second error signal, and to generate a corresponding charge;
a low-pass filter (LPF) coupled to receive said charge, and to convert said charge into a voltage;
a voltage controlled oscillator (VCO) coupled to receive said voltage, and to generate an output signal; and
a frequency divider coupled to receive said output signal, and to divide a frequency of said output signal to generate said feedback frequency,
wherein said PFD comprises:
a first circuit portion to receive said reference signal (Fref) and to activate said first error signal (UP) if the phase of said reference frequency (Fref) leads the phase of said feedback signal (Ffb); and
a second circuit portion to receive said feedback signal (Ffb) and to activate said second error signal (DOWN) if the phase of said reference frequency (Fref) lags the phase of said feedback signal (Ffb),
wherein said first circuit portion is powered by a first power supply, and wherein said second circuit portion is powered by a second power supply, wherein said first power supply is different from said second power supply.

16. The system of claim 15, wherein said signal processing block comprises:
an analog to digital convert (ADC) coupled to receive said input signal, said ADC to sample said input signal at said time instants specified by said sampling clock, and to generate a sequence of digital codes representing said input signal; and
a processing block to process said sequence of digital codes.

17. The system of claim 16, wherein said PLL further comprises a first voltage regulator and a second voltage regulator, wherein said first power supply is received at a first node of said PFD, said first node being connected directly to said first voltage regulator,
wherein said second power supply node is received at a second node of said PFD, said second node being connected directly to said second voltage regulator,
wherein each of said first voltage regulator and said second voltage regulator receives a same unregulated power supply, said first regulator generating said first power supply at said first node, and said second voltage regulator generating said second power supply at said second node.

18. The system of claim 17, wherein said PLL further comprises a first filter, a second filter, and a voltage regulator, wherein said first power supply is received at a first node of said PFD, wherein said first node is directly connected to an output of said first filter, wherein said first filter is coupled to an output of said voltage regulator, wherein said second power supply is received at a second node, wherein said second node is directly connected to an output of said second filter, wherein said second filter is coupled to said output of said voltage regulator.

19. The system of claim 18, wherein said PLL further comprises a third filter and a logic gate, said logic gate coupled to receive each of said first error signal and said second error signal, an output of said logic gate coupled to a reset input of each of said first circuit portion and said second circuit portion, wherein said logic gate is powered by a third power supply obtained at an output of said third filter, wherein said third filter is coupled to said output of said voltage regulator.

20. The system of claim 19, wherein said PLL further comprises a delay element, said delay element to delay said output of said logic gate, wherein said third power supply is also used to power said delay element.

\* \* \* \* \*